United States Patent
Breuer et al.

(12) 
(10) Patent No.: US 7,492,554 B2
(45) Date of Patent: Feb. 17, 2009

(54) MAGNETIC SENSOR WITH TILTED MAGNETORESISTIVE STRUCTURES

(75) Inventors: Marcus Breuer, Dalheim (DE); Guenther Crolly, Kirchheimbolanden (DE); Michael Haag, Rodenbach (DE); Manfred Jung, Limburg (DE); Thorsten Muehge, Budenheim (DE); Johannes Paul, Mainz (DE); Joerg Sauerwein, Mainz (DE); Rolf Schaefer, Mainz (DE); Alexandra Welzel, Hahnheim (DE)

(73) Assignee: International Business Machines Corporation, Armonk, NY (US)

( * ) Notice: Subject to any disclaimer, the term of this patent is extended or adjusted under 35 U.S.C. 154(b) by 378 days.

(21) Appl. No.: 11/335,965

(22) Filed: Jan. 20, 2006

(65) Prior Publication Data

US 2006/0171081 A1 Aug. 3, 2006

(30) Foreign Application Priority Data

Jan. 21, 2005 (EP) ................................... 05100383

(51) Int. Cl.
*G11B 5/33* (2006.01)

(52) U.S. Cl. ...................................................... 360/313
(58) Field of Classification Search ................. 360/313, 360/314, 315
See application file for complete search history.

(56) References Cited

U.S. PATENT DOCUMENTS

| | | | | | |
|---|---|---|---|---|---|
| 5,680,091 | A | * | 10/1997 | Maeda et al. | ............. 338/32 R |
| 5,867,025 | A | * | 2/1999 | Allenspach et al. | ......... 324/252 |
| 6,104,189 | A | * | 8/2000 | Allenspach et al. | ......... 324/252 |
| 6,282,067 | B1 | * | 8/2001 | Machida et al. | ............. 360/316 |
| 6,433,535 | B1 | * | 8/2002 | Marx et al. | ............ 324/207.21 |
| 7,221,157 | B2 | * | 5/2007 | Wakabayashi et al. | ...... 324/251 |
| 7,358,722 | B2 | * | 4/2008 | Peczalski et al. | ............ 324/247 |
| 2002/0167309 | A1 | * | 11/2002 | Chaparala | .............. 324/207.21 |

* cited by examiner

*Primary Examiner*—Angel A. Castro
(74) *Attorney, Agent, or Firm*—Zilka-Kotab, PC

(57) ABSTRACT

A magnetic field sensor device comprising a substrate having at least a first tilted planar section having a surface normal at a first angle with respect to a surface normal of the substrate, and at least a first magnetoresistive layered structure positioned at the at least first tilted section. Methods for manufacturing magnetic field sensor devices are also presented.

15 Claims, 6 Drawing Sheets

MAGNETIC SENSOR WITH TILTED MAGNETORESISTIVE STRUCTURES

FIELD OF THE INVENTION

The present invention relates to the field of magnetic sensors and magnetic sensor devices making use of magnetoresistive structures and in particular without limitations to magnetoresistive layered structures having an electric resistance that depends on an applied magnetic field.

BACKGROUND AND PRIOR ART

Magnetoresistive elements feature an electrical resistance that strongly depends on the magnitude and/or a direction of an externally applied magnetic field. By means of magnetoresistive elements, electrical signals can be generated that are indicative of magnetic field strength and/or direction. These elements are therefore suitable for a large range of applications in the framework of magnetic field measuring and determination. In particular in applications for touch less measuring of rotation angles and revolution speeds, magnetic sensors making use of magnetoresistive elements play a predominant role. Also, magnetoresistive elements are widely applied for magnetic gradiometers as well as magnetic card reading and magnetic encoding devices.

There exists a large variety of different magnetoresistive elements exploiting various fundamental effects. For example, devices featuring an Anisotropic Magnetoresistive (AMR) effect, show a change in electrical resistance in the presence of a magnetic field. AMR sensors are typically made of a soft-magnetic material, such as nickel-iron (Permalloy), thin film deposited on e.g. a silicon wafer. Here, the magnetoresistive effect is mainly given by the relative direction between an electrical current flowing through the AMR element and the direction of magnetization of the soft-magnetic thin film.

Another effect denoted as Giant Magneto Resistance (GMR) can be exploited by making use of multilayer systems. Here, the magnetoresistive element features a stack of alternating magnetic and non-magnetic layers.

In an initial configuration, i.e. in the absence of an external magnetic field, magnetization direction of adjacent magnetic layers of the GMR element are coupled in an anti-parallel way. Variations of the electrical resistance arise due to modifications of the magnetization direction of the adjacently positioned magnetic layers. For instance, if a magnetic field is applied, the magnetic force between the magnetic field and the magnetization of the ferromagnetic layers attempts to align the magnetizations of the adjacent layers in a parallel way. Consequently, in the presence of a magnetic field, the magnetization orientation between two adjacent layers is something between parallel i.e. for strong magnetic fields, and anti-parallel, i.e. for zero or very low magnetic field, and depends on the strength of the magnetic field. Typically, the resistance of a GMR element is maximal for an anti-parallel orientation and becomes minimal for a parallel orientation of adjacent magnetic layers.

GMR-spinvalve systems typically feature two layers of ferromagnetic material and one layer of anti-ferromagnetic material. The antiferromagnetic layer is serving as a pinning layer that fixes permanently ,i.e. pins, the magnetization direction of the first ferromagnetic layer along a predefined direction within the plane of the layer. The second ferromagnetic layer, also denoted as free layer can be magnetized in arbitrary directions in the plane of the layer and is free to follow the direction of an externally applied magnetic field. Mutual orientation of the magnetization of the pinning and the pinned layer finally determines the electrical resistance of the GMR-spinvalve system. Further, magnetoresistive elements may feature a number of similar effects, such as the Tunnel Magnetoresistive effects (TMR) that may exhibit when two adjacent ferromagnetic layers, e.g. of a GMR element, are separated by means of a thin layer of isolating material.

Magnetoresistive elements can be produced on a large scale by means of surface treatment and material deposition technologies that are, e.g. known in the field of semi-conductor manufacturing technology. For instance, hundreds or even thousands of magnetoresistive elements can be simultaneously produced on a common wafer in a cost efficient way.

Due to the symmetry of their underlying physical effects magnetoresistive multilayer elements inherently do not provide determination of the absolute direction of a magnetic field. However, by combining numerous magnetoresistive spinvalve elements, e.g. such as in a Wheatstone bridge, in principle also the direction of a magnetic field can be unequivocally determined. For instance, by making use of several GMR-spinvalve elements, each of which features a 180° ambiguity, directional magnetic sensors can be built, if the GMR-spinvalve elements and in particular their pinning layers are magnetized along different directions.

However, for various magnetic field sensor applications a manual positioning and orienting of various magnetoresistive elements is rather cost intensive and may reduce measurement accuracy of the magnetic sensor device. Also, magnetic sensors making use of magnetoresistive elements are commonly only sensitive to magnetic fields that coincide with the plane of the layered structures. Hence, magnetic sensors making use of magnetoresistive elements featuring a planar structure are typically insensitive to magnetic field components pointing in a direction that is substantially perpendicular to the planar surface of the magnetoresistive elements. Hence, building a magnetic sensor device capable of determining a magnetic field with respect to three spatial coordinates requires a rather sophisticated combination of magnetoresistive elements that are arranged in various orientations.

The present invention therefore aims to provide a magnetic field sensor device that is sensitive to magnetic field components that are perpendicular to the plane of a planar substrate.

SUMMARY OF THE INVENTION

A magnetic field sensor device comprising a substrate having at least a first tilted planar section having a surface normal at a first angle with respect to a surface normal of the substrate, and at least a first magnetoresistive layered structure positioned at the at least first tilted section.

Methods for manufacturing magnetic field sensor devices are also presented. One method includes applying a mask on a substrate, performing a wet etching procedure on the substrate for generating at least a first groove having tilted side walls, and depositing at least one layer of magnetoresistive material onto a section of the surface of at least a first tilted side wall of the groove.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings, in which.

DETAILED DESCRIPTION

The following description is the best mode presently contemplated for carrying out the present invention. This description is made for the purpose of illustrating the general principles of the present invention and is not meant to limit the inventive concepts claimed herein. Further, particular features described herein can be used in combination with other described features in each of the various possible combinations and permutations.

Figure 1:
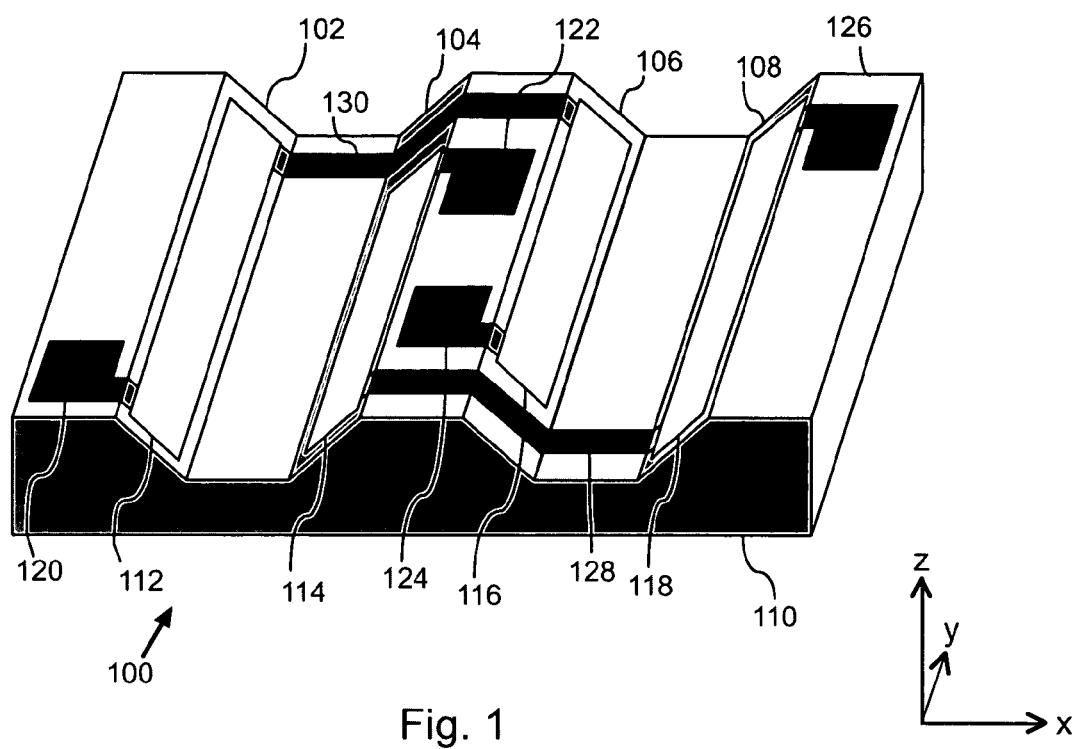
FIG. 1 shows a perspective illustration of the magnetic field sensor device.

FIG. 1 is illustrative of a perspective view of the magnetic field sensor device 100. Magnetic field sensor device 100 has a planar substrate 110 featuring two parallel oriented grooves. The two grooves have side walls acting as tilted planar sections and providing a basis for deposition of magnetoresistive layered structures. In particular, the planar substrate has one or more tilted planar sections 102, 104, 106 and 108 (four tilted planar sections shown), wherein planar sections 102 and 106 are oriented in the same parallel way. Similarly, planar sections 104 and 108 are oriented in the same parallel way relative to each other. Each tilted planar section has a surface normal at an angle with respect to the surface normal of the planar substrate.

According to one embodiment of the invention, one tilted planar section, e.g., section 102, is tilted with respect to a first tilt axis and a second tilted planar section, e.g., section 104, is tilted with respect to a second tilt axis. Further, first and second tilt axes may be substantially parallel. In this way the surface normals of the first and second tilted planar sections, e.g., 102, 104 coincide with a plane that is substantially perpendicular to the surface of the planar substrate 110. However, first and second tilted planar sections 102, 104 may be tilted with respect to first and second angles that are not equal. Such a configuration may evolve by etching a groove into the surface of the planar substrate that features side walls with different angles of inclination. A description of an illustrative etching process is provided below.

Additionally, each one of the planar sections 102, 104, 106, 108 provides tilted positioning of magnetoresistive layered structures 112, 114, 116 and 118. Hence, magnetoresistive layered structures 112, 114, 116, 118 feature the same orientation as the planar sections 102, 104, 106, 108. In particular, magnetoresistive element 112 is positioned at planar section 102, magnetoresistive element 114 is positioned at planar section 104, magnetoresistive element 116 is positioned at planar section 106 and magnetoresistive element 118 is positioned at planar section 108. The surfaces of the magnetoresistive layered structures 112, 114, 116, 118 are therefore tilted with respect to the surface of the planar substrate 110.

Additionally, each one of the magnetoresistive elements 112, 114, 116, 118 is electrically connected to a contact electrode 120, 122, 124 and 126. This allows for efficient and uncomplicated connecting of the magnetoresistive elements to signal analysis means as well as to voltage or current supply. Further, parallel oriented magnetoresistive elements 112, 116 are electrically interconnected by means of conducting stripe 130 and magnetoresistive elements 114, 118 are electrically interconnected by means of conductive stripe 128. In this way, parallel oriented magnetoresistive elements 112, 116 are coupled in series and the electrical resistance that can be measured between contact electrodes 120 and 124 substantially equals the electrical resistance of magnetoresistive element 112 plus electrical resistance of magnetoresistive element 116.

Consequently, by interconnecting parallel oriented magnetoresistive elements arbitrary electrical resistance can be realized. Electrically interconnecting parallel oriented magnetoresistive elements is advantageous because due to practical reasons the planar sections 102, 104, 106 108 as well as their corresponding magnetoresistive elements 112, 114, 116, 118 are limited in size. On the other hand, it would be rather impractical to increase the surface of a planar section 102 and its corresponding magnetoresistive element 112 by etching a deeper groove into the substrate or by expanding the substrate and hence the entire magnetic field sensor device in the y-direction.

Interconnecting parallel oriented magnetoresistive elements 112, 116 by means of conductive stripes 130 either in series or in a parallel way therefore represents a cost efficient and intuitive way of designing magnetoresistive combined structures with arbitrary electrical resistance.

As can be seen from FIG. 1, the planar substrate is oriented in the x-y plane and the tilted planar sections 102, 104, 106 108 lie within planes that are tilted with respect to the plane of the lower surface of the planar substrate 110. Applying a magnetic field in the z-direction, magnetoresistive elements 112, 114, 116, 118 are principally enabled to sense and to detect a component of the magnetic field that coincides with the plane of the layered structures 112, 114, 116, 118. In this way the magnetic field sensor device 100 becomes sensitive to magnetic fields pointing in a direction being substantially perpendicular to the plane of the substrate.

When a magnetic field points in a direction perpendicular to the surface of the planar substrate 110, a directional component of the magnetic field coincides with each plane specified by the planar surfaces of the magnetoresistive layered structures 112, 114, 116, 118. The magnetoresistive layered structures 112, 114, 116, 118 may be or include AMR, GMR, GMR-spinvalve, TMR elements, and combinations thereof. Since magnetoresistive layered structures, such as AMR, GMR, GMR-spinvalve or TMR elements are sensitive to magnetic fields that coincide with the magnetic layer, the magnetoresistive layered structures are sensitive to the component of the magnetic field that coincides with the plane of the layers of the respective magnetoresistive layered structure. Depending on the field of application of the magnetic field sensor device, any of the above mentioned magnetoresistive effects or elements might be preferably applicable.

Hence, the magnetic field sensor device may combine two (or more) magnetoresistive layered structures 112, 114, 116, 118 that are tilted with respect to the surface of the planar substrate 110 at different angles, e.g., structure 112 relative to structure 114, and structure 116 relative to structure 118. See also FIG. 6 and related description below. Since each of the magnetoresistive layered structures 112, 114, 116, 118 is sensitive to magnetic field components coinciding with the plane specified by the layers of the respective magnetoresistive layered structures, a first magnetoresistive layered structure, e.g., structure 112 might be sensitive to magnetic field components other than those detected by a second magnetoresistive layered structure e.g., structure 114. Principally, by driving the at least first and second magnetoresistive structures with a driving voltage and measuring their electric resistance as a function of direction of an applied magnetic field, magnetic field components pointing either in the x-, y- or z-direction are sufficiently detectable.

According to a further embodiment of the invention, the magnetoresistive layered structures are electrically interconnected and form a bridge circuit. Hence, electric interconnects are by no means limited to serve as conductors between parallel oriented but also to serve as conductors between magnetoresistive layered structures that are oriented at different angles with respect to the surface of the planar substrate. For instance, first and second or first and third magnetoresistive layered structures might be pair-wise arranged in a bridge circuit, such as a Wheatstone bridge.

Typically, in a corresponding circuit diagram, magnetoresistive layered structures of equal type, i.e. magnetoresistive elements featuring the same orientation, might be arranged crosswise and opposite with respect to each other. Hence, magnetoresistive elements of different type are directly connected in the bridge circuit. Driving the bridge with some predefined voltage or current, the bridge output signal might be directly indicative of orientation and/or magnitude of the applied magnetic field depending on which concrete type of magnetoresistive element is actually implemented in the bridge circuit.

Moreover, magnetoresistive layered structures of a bridge circuit may in turn comprise various parallel oriented and electrically interconnected magnetoresistive elements. In this way also the total electric resistance of the various resistors of a bridge circuit can be designed in an appropriate way.

Figure 2:
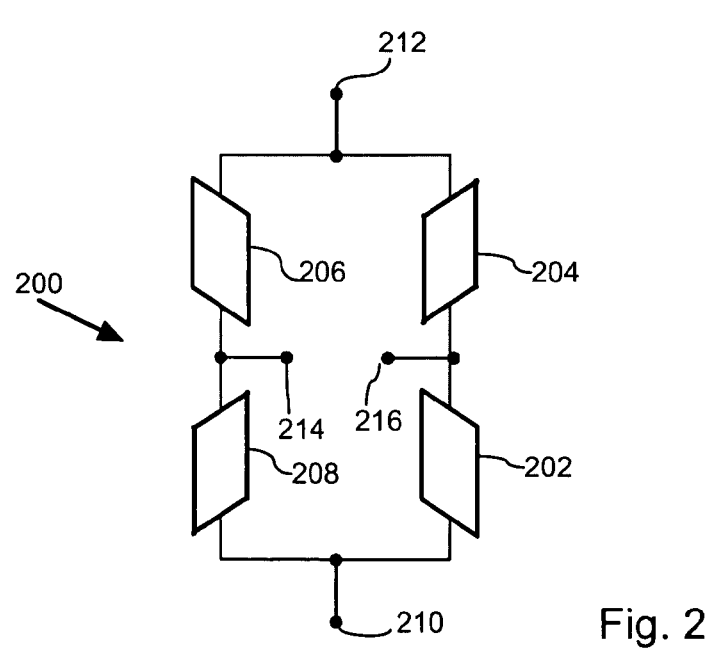
FIG. 2 schematically shows a circuit diagram of a Wheatstone bridge.

FIG. 2 illustrates a circuit diagram 200 of a Wheatstone bridge making use of four magnetoresistive elements 202, 204, 206, 208. Wheatstone bridge 200 further has contact electrodes 210, 212 as well as contact electrodes 214, 216 that are adapted to be connected to a voltage or current supply and to be connected to some kind of signal analysis or processing unit. For instance, by coupling electrodes 210 and 212 to a voltage supply, the bridge output can be measured across electrodes 214 and 216. Typically, Wheatstone bridge assemblies 200 directly provide a signal that is indicative of the relative changes of the resistance of the various magnetoresistive elements 202, 204, 206, 208 irrespective of the absolute resistance value.

In particular, magnetoresistive elements 206 and 204 are illustrated as oppositely sheared rectangular structures, thus indicating that magnetoresistive element 206 features a different tilt angle with respect to the surface of the planar substrate than magnetoresistive element 204. Further, magnetoresistive elements 202 and 206 feature a common orientation and magnetoresistive elements 204 and 208 also feature a common orientation. Hence, parallel oriented magnetoresistive elements 206, 202 and 208, 204 are arranged at opposite positions of the illustrated circuit diagram 200. For instance magnetoresistive element 206 may correspond to a combined structure of magnetoresistive elements 112 and 116 of FIG. 1 and magnetoresistive element 204 may correspond to the combined structure of magnetoresistive elements 114 and 118. Hence, contact electrode 120 of FIG. 1 may correspond to contact electrode 212 of FIG. 2 and contact electrode 124 of FIG. 1 may correspond to contact electrode 214.

Figure 3:
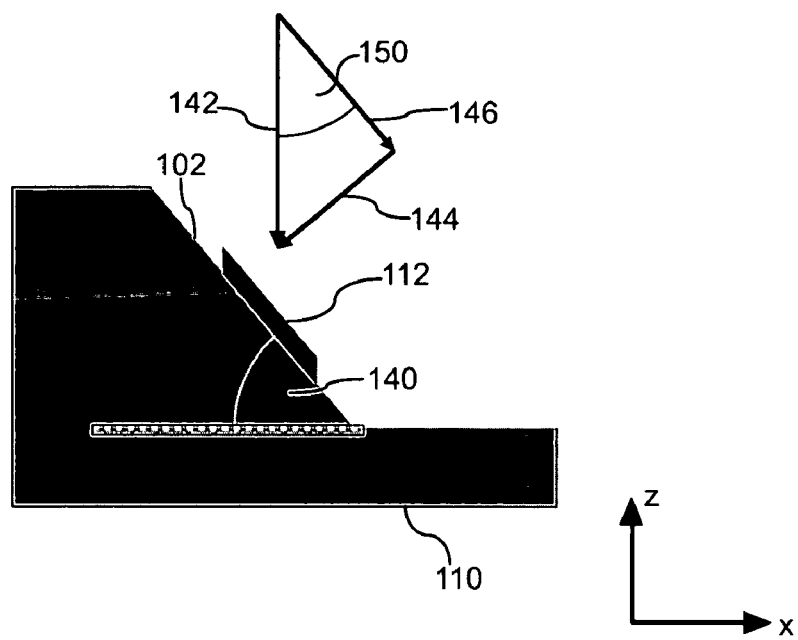
FIG. 3 shows a cross section of the magnetic field sensor device.

FIG. 3 illustrates a cross section through the magnetic sensor device illustrated in FIG. 1. The cross section refers to the left part of the perspective illustration of the sensor device 100 of FIG. 1. As can be seen the planar section 102 is tilted with respect to the surface of the substrate 110 by an angle α 140. Further, magnetoresistive element 112 is positioned at the tilted planar section 102 and its surface is substantially parallel to the surface of the planar section 102. Arrow 142 represents a magnetic field pointing in the negative z-direction. This magnetic field 142 can be decomposed into a component 146 and a component 144.

Component 146 is parallel to the plane given by the layer 112. Hence, magnetic field component 146 can be sensed and precisely measured by means of the magnetoresistive element 112. In contrast, magnetic field component 144 is substantially perpendicular to the surface of the magnetoresistive element 112, i.e. component 144 is substantially parallel to the surface normal of magnetoresistive element 112. This magnetic field component 144 therefore cannot be sensed and measured by means of the magnetoresistive element 112. It also does not influence the measurement of the component 146.

Decomposition of magnetic field 142 is governed by the tilt angle α 140. The angle γ 150 between magnetic field vector 142 and magnetic field component 146 is given by 90°−α. Hence, by measuring magnetic field component 146 by means of magnetoresistive element 112 magnitude of the magnetic field 142 can be determined by dividing the measured value corresponding to component 146 by a factor of cos(90°−α).

Figure 4:
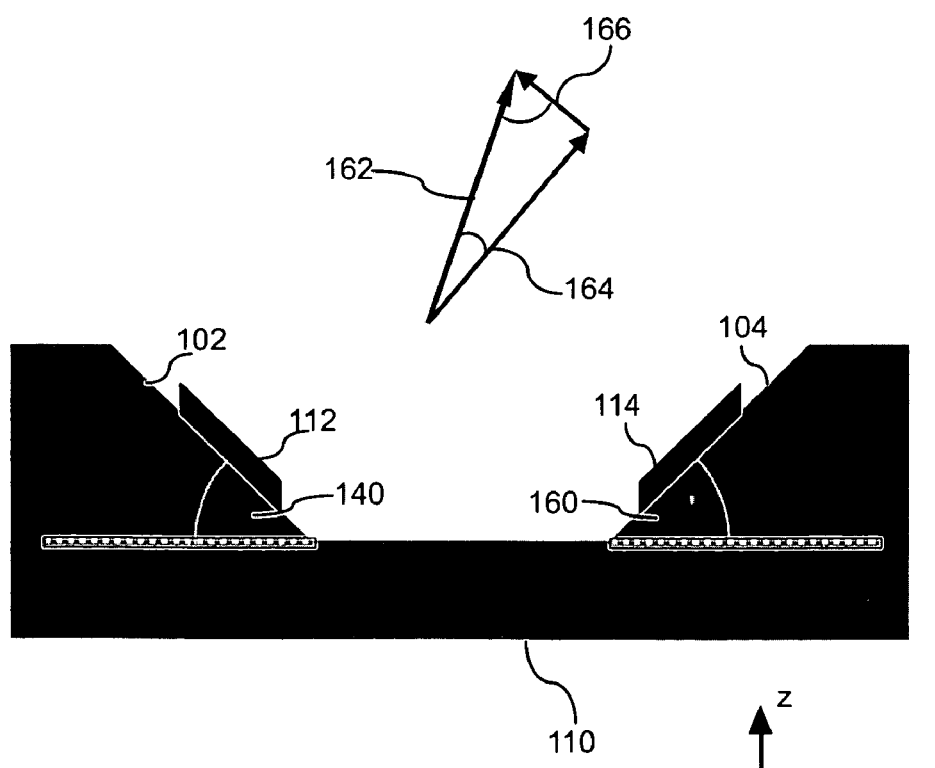
FIG. 4 shows a cross section of a magnetic field sensor device having a first and a second tilted planar section, FIG. 5 schematically shows a tilted plane of sensitivity and magnetic field decomposition, FIG. 6 gives a perspective illustration of a magnetic field decomposition with two differently oriented magnetoresistive elements.

FIG. 4 illustrates a similar cross sectional view of the sensor device 100 as already shown in FIG. 3. Here, tilted planar section 102 and oppositely located tilted planar section 104 are illustrated. Additionally, planar section 104 has magnetoresistive element 114. As can be further seen planar section 104 is tilted in an opposite direction as planar section 102 by an angle α' 160 with respect to the surface of the planar substrate 110. Angles α 140 and α' 160 may be equal in magnitude but may also differ. Hence, the tilted planar sections 102, 104 are tilted with respect to mutually parallel tilt axes. This configuration may e.g., correspond to a groove that has side walls that are inclined at the same angle with respect to the surface of the planar substrate 110.

In general, the magnitude of angle α is governed by the crystallographic structure of the substrate 110. As will be discussed in more detail below, the tilt angle may be determined by means of the [111], the [110] or [100] crystallographic axis of the substrate. Depending on the orientation of the initial surface of the planar substrate with respect to the crystallographic structure of the substrate material, also other crystallographic axes may determine the tilt angle of the planar section.

With continued reference to FIG. 4, a magnetic field 162 is illustrated that can be decomposed into components 164 and 166. Here, component 166 coincides with the plane of the magnetoresistive element 112 and component 164 substantially coincides with the plane specified by magnetoresistive element 114.

In this way magnetoresistive elements 112, 114 are separately adapted to detect and to measure the two components 166, 164 of the applied magnetic field 162. If for instance angles α and α' both have the same absolute value, e.g., both α and α' equal 45°, magnetic field components 164 and 166 are mutually perpendicular, i.e., surface normals of the respective magnetoresistive layered structures 112, 114 are substantially perpendicular with respect to each other. In this particular case, direction as well as magnitude of magnetic field 162 can be precisely determined since magnetic field component 164 equals magnitude of magnetic field 162 multiplied by $\cos(\alpha)$. In a similar way component 166 is related to the magnitude of the magnetic field 162 by $\sin(\alpha)$.

Figure 5:
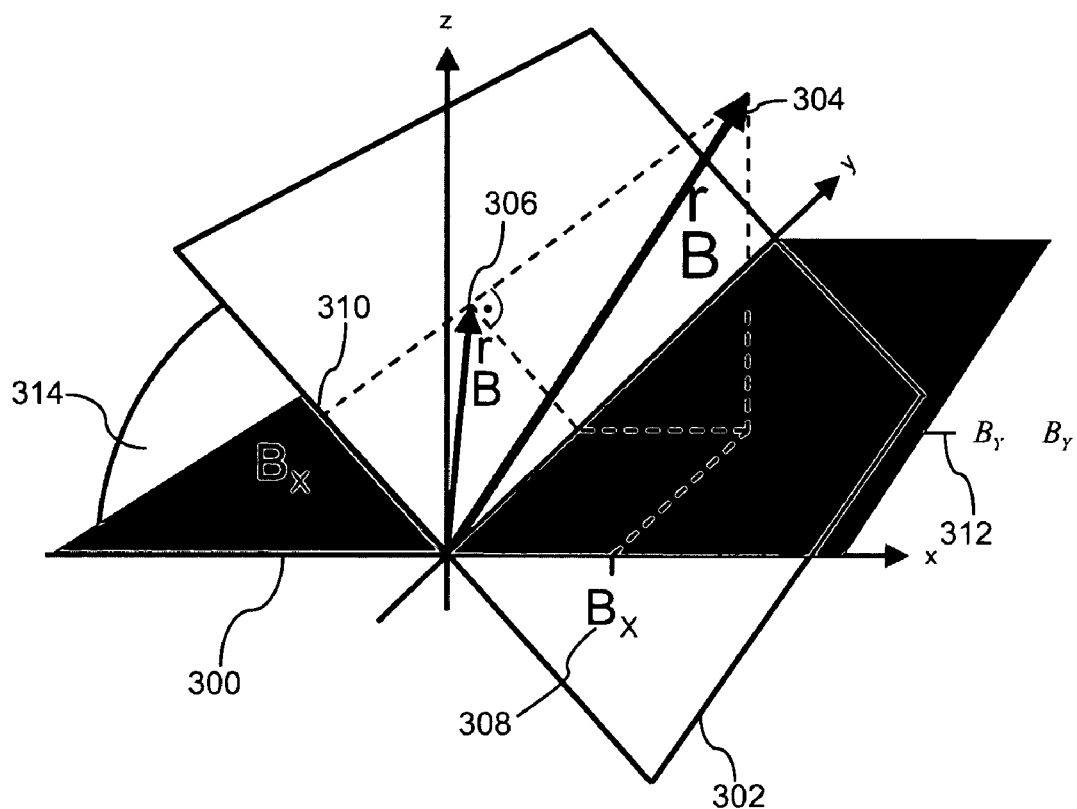

FIG. 5 gives a perspective illustration of a decomposition of a magnetic field vector 304 into components that can be measured by means of tilted magnetoresistive elements featuring a sensor plane 302. Plane 300 corresponds to the x-y plane and the tilted plane 302 is tilted by angle $\alpha$ 314 with respect to plane 300 by making use of the y axis as rotation axis. Magnetic field vector 304 can be decomposed into $B_x$ 308 and $B_y$ 312. Since the y-axis serves as a rotation axis when transforming plane 302 into plane 300, the y-component of the magnetic field 304 remains unchanged with respect to the planar projection the B' 306 of magnetic field vector 304 in the plane 302.

Coordinates of the plane 300 and the sensor plane 302 can be transformed by some standard coordinate system transformation scheme. This allows extraction of a z-component of the magnetic field 304 by means of the $B_x'$ component 310 of the projected magnetic field vector 306. A transformation rule can e.g. be determined as follows:

$$B_X' = (B_X^2 + B_Y^2)^{1/2} \cdot \cos\left(\pi - \alpha - \arctan\frac{B_X}{B_Z}\right)$$

$$B_Y' = B_Y.$$

Figure 6:
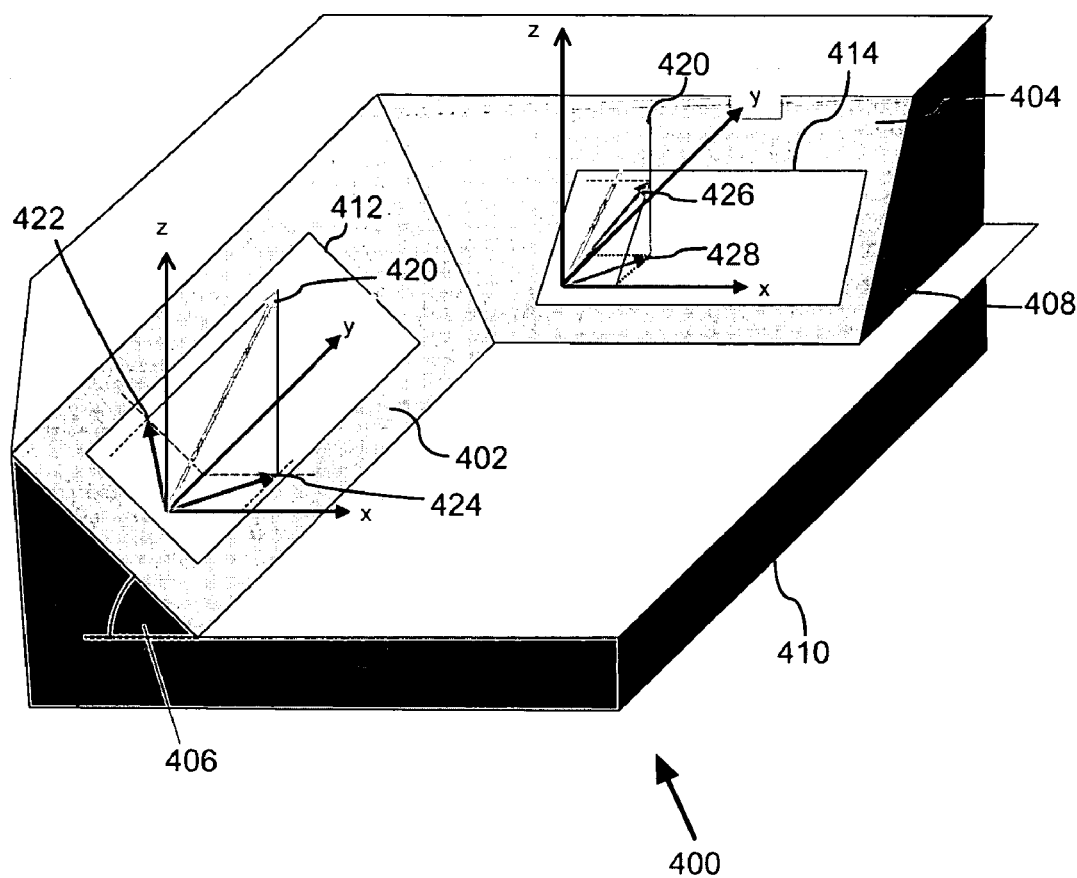

FIG. 6 is illustrative of a perspective view of the magnetic sensor device 400 making use of tilted planar sections 402, 404 that are not parallel. For instance, planar section 402 is tilted by angle $\alpha$ 406 from a tilt axis defined along the x-axis. The orientation of planar section 404 with respect to the surface of the substrate 410 can be described by angle $\beta$ 408 from a tilt axis defined along the y-axis. Planar section 412 coincides with the y-direction and planar section 414 coincides with the x-direction. Angles $\alpha$ and $\beta$ 406 and 408 specify the tilt angle between planar sections 412, 414 with respect to the z axis, respectively.

An applied magnetic field 420 is effectively decomposed into components 422 and 424 by means of magnetoresistive element 412 and the same magnetic field 420 is decomposed in different components 426 and 428 by means of magnetoresistive element 414. Hence, magnetoresistive elements 412 and 414 are sensitive to a magnetic field with respect to four different components 422, 424, 426, 428. Measuring the magnitude of the components 422, 424, 426, 428 and linearly combining components 422, 424, 426, 428 may allow determination of the magnitude and direction of applied magnetic field 420 with respect to the three spatial coordinates x, y and z. Hence, the magnetoresistive elements 412, 414 then become sensitive to magnetic field components in the x-z- and in the y-z- plane, respectively.

Other embodiments are also contemplated. For example, by combining features of a structure as shown in FIG. 4, i.e., the planar sections tilt away from each other, with a nonparallel planar section 404 and magnetoresistive element 414 as shown in FIG. 5, three differently oriented magnetoresistive layered structures can be positioned on a common substrate at various tilt angles. The inventive magnetic field sensor therefore may serve as a basis for three dimensional detection and determination of orientation of a magnetic field. The sensor device features the advantage that various magnetoresistive layered structures are inherently positioned at differently tilted planar sections. Hence, there is no need of manually arranging and positioning various magnetoresistive elements. Likewise, additional planar sections and magnetoresistive elements may be added to any of the embodiments described herein.

According to an embodiment of the invention, one or more of the tilted planar sections are generated by an anisotropic wet etching process. Anisotropic wet etching denotes etching processes featuring different etching speeds along the crystallographic axis of the substrate. In this way grooves in a planar substrate can be produced featuring a geometry that corresponds to the crystallographic structure of the substrate.

For instance, by making use of silicon as substrate material featuring a surface normal that corresponds to the [100] crystallographic direction, an anisotropic wet etching process may produce tilted side walls of a groove featuring a surface normal of [110]. In this case the relative angle between the surface normal of the tilted side wall and the planar substrate may equal 45°. Various other predefined angles can be realized by making use of silicone substrates that feature surface normals parallel to, e.g., the [111] crystallographic axis or [110] crystallographic axis.

Hence, the side wall of a groove that is etched into the planar substrate inherently provides an almost perfect planar surface. Consequently, the surface roughness of the tilted planar sections 102, 104 is almost negligible. Due to such a surface property, the associated magnetoresistive layered structure also provides a corresponding degree of surface roughness, which is advantageous with respect to accuracy as well as sensitivity of the magnetic field sensor device. Moreover, since the tilt angle is determined by a crystallographic axis, when etching a large number of grooves into the planar substrate 110, the side walls of each groove may be exactly parallel oriented and the tilt angles are exactly equal. Therefore, the various magnetoresistive layered structures can be inherently oriented with respect to arbitrary tilt angles at a very high accuracy, that may never be reached by a manual arrangement procedure.

Figure 7:
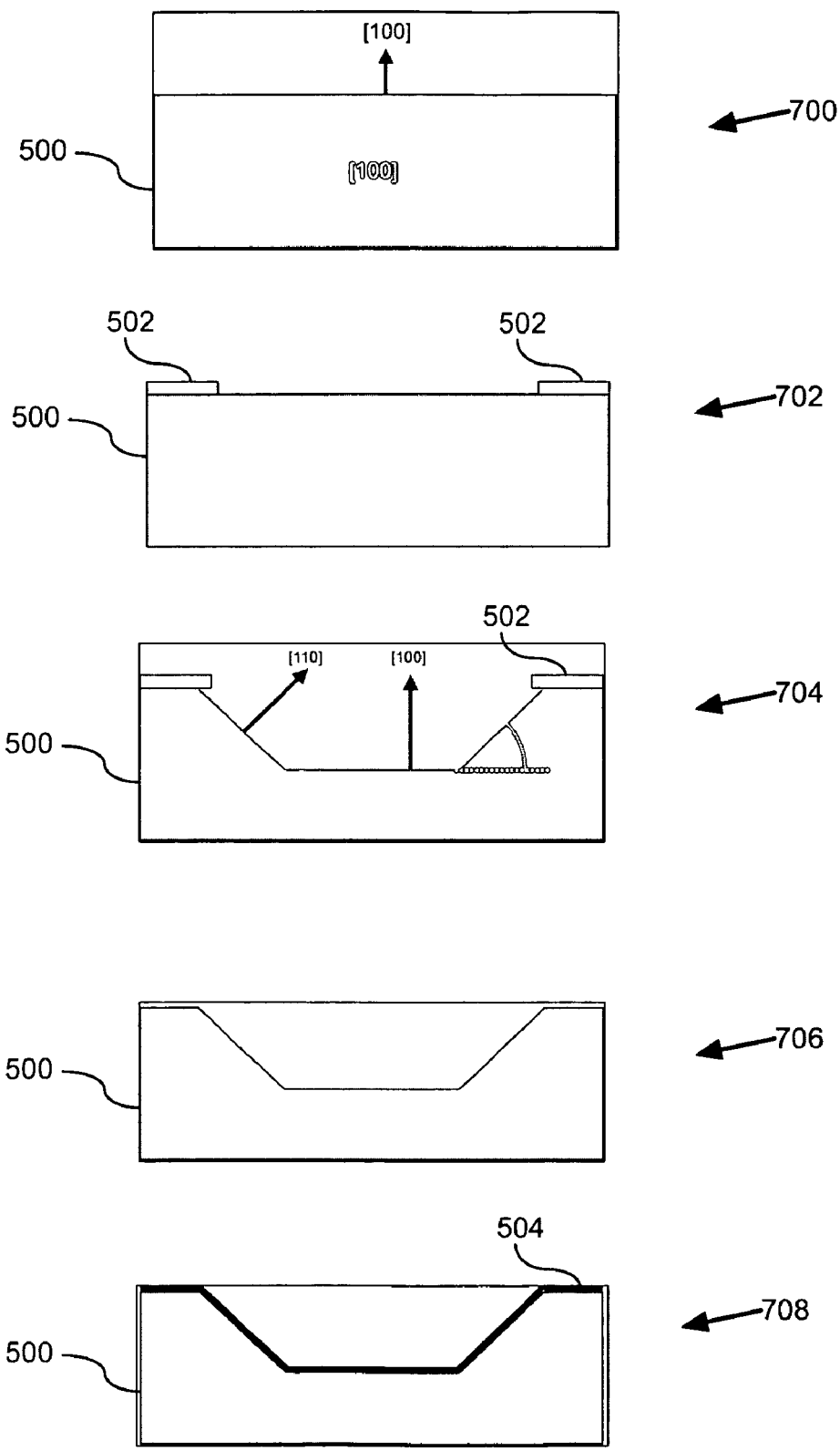
FIG. 7 illustrates production steps of a production process for manufacturing the magnetic field sensor device.

FIG. 7 shows various steps 700, 702, 704, 706 and 708 of manufacturing the magnetic field sensor device according to one embodiment of the present invention. Preferably, a substrate 500 becomes subject to an anisotropic wet etching procedure providing the required tilted planar sections with high precision and with a sufficient surface roughness. In the first illustration 700 a cross section through a planar substrate, e.g. crystalline silicon with a surface normal that corresponds to the crystallographic axis [100] is shown. In a successive step given by illustration 702, protective masks 502 are positioned at the upper left and right part of the substrate 500. These masks 502 serve to protect the surface and to confine the following wet etching procedure to a particular section of the surface.

The result of the wet etching procedure is shown by illustration 704. The Anisotropic wet etching providing different etching speeds along different crystallographic axis leaves a structure as shown by illustration 704. Here, tilted planar sections corresponding to tilted planar section 102 and 104 of FIG. 4 can be identified. Due to the wet etching procedure, the tilted planar surface has a surface normal that corresponds to the [110] crystallographic axis of the substrate 500. In a successive step 706, the masks 502 are removed and thereafter at least one layer of magnetoresistive material 504 is deposited on the grooved substrate 500 as depicted by illustration 708.

Since deposition of magnetoresistive material 504 should be performed with a high accuracy, the thickness of the sputtered layer 504 may be determined, preferably even during the sputtering or deposition process. Since the magnetoresistive material is typically deposited in a vertical direction, the deposition rate at the inclined sections of the profile might be lower than a deposition rate at surface areas that are horizontal. However, variations between deposition rates can be correlated and mainly depend on the angle α between the tilted surface and the planar surface of the substrate. Having knowledge of the difference in layered deposition rate for a given deposition apparatus and a given groove geometry thickness of deposited material at tilted sections can be determined by measuring the layer thickness of a reference layer that is substantially parallel to the surface of the substrate. Particularly, the thickness of the reference layer and the thickness of the layer of magnetoresistive material 504 can be mutually correlated and this correlation can be determined by means of a calibration procedure and remains substantially constant for a dedicated deposition process. The thickness of the reference layer can be effectively determined by standard monitoring means that are typically applied in deposition processes.

Figure 8:
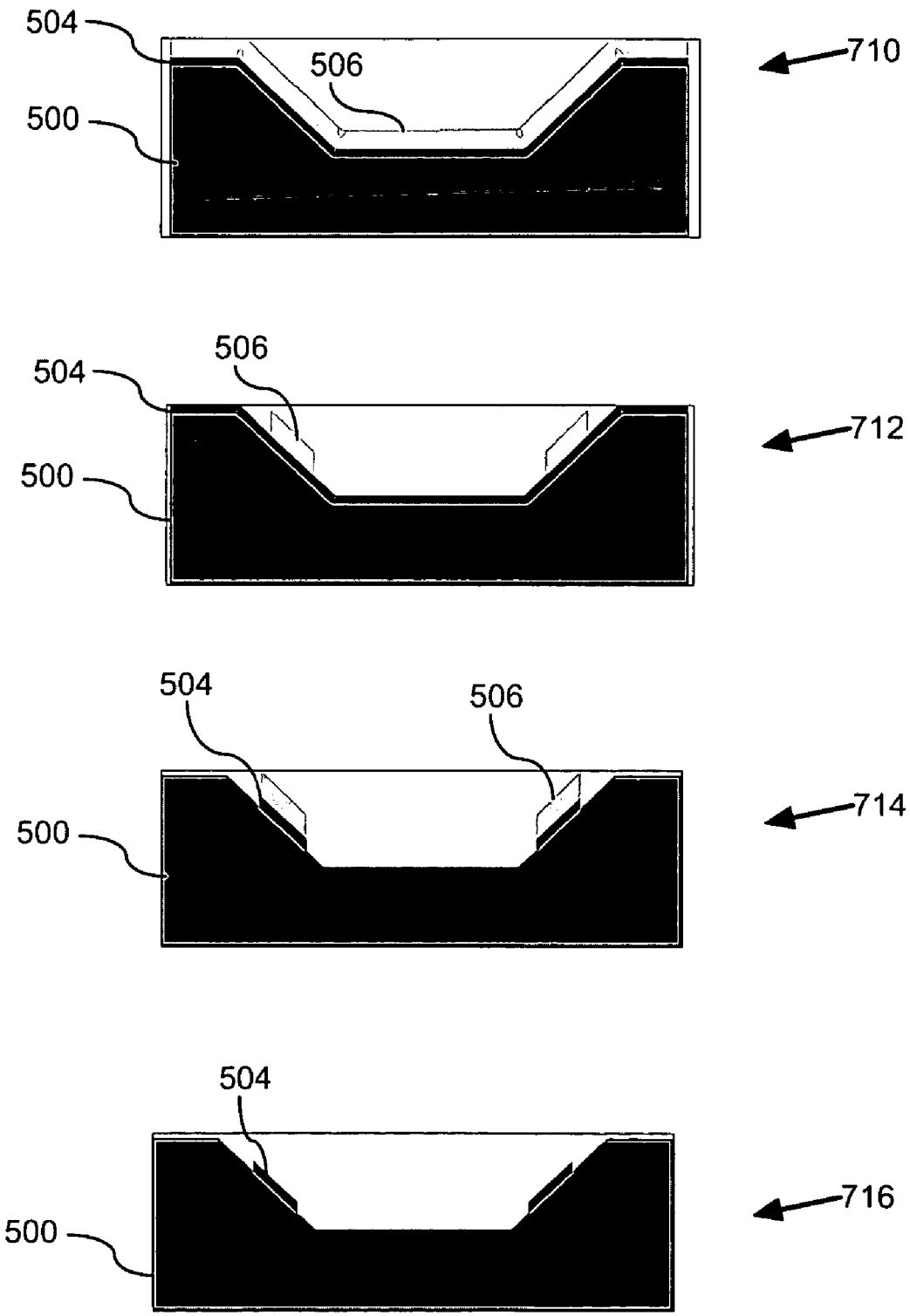
FIG. 8 illustrates the final steps of manufacturing the magnetic field sensor device.

The remaining steps of manufacturing the inventive magnetic field sensor device are illustrated in FIG. 8. Illustration 710 depicts a corresponding cross section after deposition of a layer of photoresist 506 on top of the at least one layer of magnetoresistive material 504. Thereafter, as shown in illustration 712 the photoresist is exposed to a spatial pattern of radiation allowing removal of selected areas of the photoresist after development.

Thereafter an ablation process can be performed in order to remove the layer of magnetoresistive material 504 in those areas that are not protected by the photoresist 506. After such an ablation procedure, e.g., ion milling, a structure as depicted by illustration 714 remains. Thereafter, only photoresist 506 may be removed leaving a structure as depicted by illustration 716 that corresponds to illustration of the sensor device as depicted in FIG. 4.

As mentioned above, interconnecting parallel oriented magnetoresistive elements, e.g., 112, 116 of FIG. 1, by means of electrically conductive stripes either in series or in a parallel way represents a cost efficient and intuitive way of designing magnetoresistive combined structures with arbitrary electrical resistance. Further, this effectively allows increasing the absolute electrical resistance of a magnetoresistive structure having the first and the fourth magnetoresistive layered structure. In this way various parallel oriented magnetoresistive structures can be electrically combined in order to form an electric resistor that features a desired absolute resistance, that might be required for a given application. Also, the total resistance of a combination of parallel oriented magnetoresistive layered structures can be reduced by electrically interconnecting the magnetoresistive elements in a parallel way.

Due to limitations of a groove etching procedure, the tilted planar surfaces might not be producible at an arbitrary large geometry. Hence, also the magnetoresistive layered structures positioned at the tilted planar sections of the surface may not exceed a distinct size and their absolute electrical resistance might be rather low. In this way, by electrically interconnecting various parallel oriented magnetoresistive layered structures, tilted magnetoresistive elements of arbitrary electrical resistance can in principle be generated.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

The invention claimed is:

1. A magnetic field sensor device comprising:
   a substrate having a first planar section and at least a first tilted planar section, wherein the at least first tilted planar section intersects with the first planar section such that an imaginary line normal to the surface of the first planar section intersects with an imaginary line normal to the surface of the at least first tilted planar section at a first angle; and
   at least a first magnetoresistive layered structure positioned at the at least first tilted section; and
   at least a second tilted planar section, wherein the at least second tilted planar section intersects with the first planar section such that an imaginary line normal to the surface of the first planar section intersects with an imaginary line normal to the surface of the at least second tilted planar section at a second angle; and
   at least a second magnetoresistive layered structure positioned at the at least second tilted section;
   wherein a line defined alone an intersection of the first tilted planar section and the first planar section is not parallel to a line defined along an intersection of the second tilted planar section and the first planar section.

2. The magnetic field sensor device according to claim 1, wherein the at least first and second tilted planar sections are tilted in opposite directions and wherein the first and second angles have a substantially equal absolute value.

3. The magnetic field sensor device according to claim 1, wherein the at least first magnetoresistive layered structure is sensitive to a component of a magnetic field pointing in a direction substantially parallel or anti-parallel to the surface normal of the substrate.

4. The magnetic field sensor device according to claim 1, further comprising at least one other tilted planar section being tilted with respect to another tilt axis lying in the plane of the substrate and being substantially perpendicular to the tilt axis of the first tilted planar section, the at least one other tilted planar section further comprising a magnetoresistive layered structure.

5. The magnetic field sensor device according to claim 1, wherein the at least first magnetoresistive layered structure is electrically connected to at least one other magnetoresistive layered structure having a surface normal being substantially parallel to the surface normal of the at least first magnetoresistive layered structure.

6. The magnetic field sensor device according to claim 1, wherein the at least first magnetoresistive layered structure is electrically connected with the at least second magnetoresistive layered structure.

7. The magnetic field sensor device according to claim 1, wherein the at least first magnetoresistive layered structure is electrically interconnected with at least one other magnetoresistive layered structure, thereby forming a bridge circuit.

8. The magnetic field sensor device according to claim 1, wherein the at least first magnetoresistive layered structure is electrically connected to at least one contact electrode.

9. The magnetic field sensor device according to claim 1, wherein the first angle is determined by a crystallographic axis of the substrate.

10. The magnetic field sensor device according to claim 9, wherein the first angle is determined by means of at least one of a [111], [110] and [100] crystallographic axis of the substrate.

11. The magnetic field sensor device according to claim 1, wherein the at least first tilted planar section is formed at least in part by an anisotropic wet etching process.

12. The magnetic field sensor device according to claim 1, wherein the at least first magnetoresistive layered structure includes an element selected from a group consisting of a Giant Magnetoresistive Spinvalve element, a Giant Magnetoresistive Multilayer element and a Tunnel Magnetoresistive element.

13. The magnetic field sensor device according to claim 1, further comprising at least a third tilted planar section being tilted with respect to a third tilt axis lying in the plane of the substrate and being substantially perpendicular to the tilt axis of the first tilted planar section, at least a third magnetoresistive layered structure positioned at the at least third tilted planar section.

14. The magnetic field sensor device according to claim 1, wherein the first and second angles are different.

15. A magnetic field sensor device comprising:
a substrate having a first planar section and a plurality of tilted planar sections, each of the tilted planar sections having a surface angled with respect to the first planar section, and
a magnetoresistive layered structure positioned at each of the tilted sections,
wherein the tilted planar sections are oriented such that a direction of an applied magnetic field in at least one of an x-, y- and z-direction relative to the substrate is detectable based on field-induced resistance changes of the magnetoresistive layered structures,
wherein a line defined along an intersection of a first of the plurality of tilted planar sections and the first planar section is not parallel to a line defined along an intersection of a second of the plurality of tilted planar sections and the first planar section.

* * * * *